US006645696B1

(12) United States Patent
Simison et al.

(10) Patent No.: US 6,645,696 B1
(45) Date of Patent: Nov. 11, 2003

(54) PHOTOIMAGEABLE COMPOSITION

(75) Inventors: Kelby Liv Simison, Hattiesburg, MS (US); Paul Dentinger, Sonol, CA (US)

(73) Assignee: Euv LLC., Santa Clara, CA (US)

( * ) Notice: Subject to any disclaimer, the term of this patent is extended or adjusted under 35 U.S.C. 154(b) by 20 days.

(21) Appl. No.: 09/997,090

(22) Filed: Nov. 30, 2001

(51) Int. Cl.[7] .................. G03F 7/038; G03F 7/30; G03F 7/40
(52) U.S. Cl. ............... 430/280.1; 430/430; 430/324; 430/326; 430/315; 522/10; 522/14; 522/25
(58) Field of Search .............. 430/280.1, 324, 430/326, 315; 522/10, 14, 25

(56) References Cited

U.S. PATENT DOCUMENTS

| | | | | |
|---|---|---|---|---|
| 4,220,707 A | * | 9/1980 | Ohmura et al. | 430/280.1 |
| 5,264,324 A | * | 11/1993 | Emmelius et al. | 430/280.1 |
| 5,266,444 A | * | 11/1993 | Carpenter, Jr. et al. | 430/280.1 |
| 5,529,887 A | * | 6/1996 | Horn et al. | 430/331 |
| 5,861,330 A | * | 1/1999 | Baker et al. | 438/232 |
| 5,985,512 A | * | 11/1999 | Hatakeyama et al. | 430/270.1 |
| 6,103,450 A | * | 8/2000 | Choi | 430/270.1 |
| 6,168,898 B1 | * | 1/2001 | Xu et al. | 430/280.1 |
| 6,190,829 B1 | * | 2/2001 | Holmes et al. | 430/270.1 |

FOREIGN PATENT DOCUMENTS

| | | | | |
|---|---|---|---|---|
| EP | 0 887 705 A1 | * | 12/1998 | G03F/7/004 |
| GB | 1405943 | * | 9/1975 | G03C/1/71 |

* cited by examiner

Primary Examiner—Cynthia Hamilton
(74) Attorney, Agent, or Firm—Fliesler Dubb Meyer & Lovejoy LLP

(57) ABSTRACT

The use of selected buffering amines in a photoimageable composition prevents process bias which with conventional photoresists causes designed features to be distorted, especially in corners and high resolution features. It is believed that the amines react with the catalysts, e.g., photoacids, generated to create an inert salt. The presence of the amines also increases resolution. Suitable photoimageable compositions includes: (a) a multifunctional polymeric epoxy resin that is dissolved in an organic solvent wherein the epoxy resin comprises oligomers of bisphenol A that is quantitatively protected by glycidyl ether and wherein the oligomers have an average functionality that ranges from about 3 to 12; (b) a photoactive compound; and (c) an amine that is selected from the group consisting of triisobutylamine, 1,8-bis(dimethylamino)naphthalene (also known as PROTON SPONGE™), 2,2'-diazabicyclo[2.2.2] octane and mixtures thereof. The photoimageable composition is particularly suited for producing high aspect ratio metal microstructures.

37 Claims, 3 Drawing Sheets triisobutylamine, TIBA proton sponge, PS trioctylamine, TOA

N,N-bis(2,2-diethoxyethyl) methylamine, BDEEMA tributylpyridine, TBP 2,2'-diazabicyclo[2.2.2] octane, DABCO 2,4,6-triphenyltriazine, TPTA ethyl 1-piperidinepropionate, EPP triphenylamine, TPA tetramethylammonium hydroxide, TMAH 4-(imidazol-1-yl)acetophenone, IAP 1-pyrrolidino-1-cyclopentene, PCP dicyclohexylamine, DCHA FIG._1
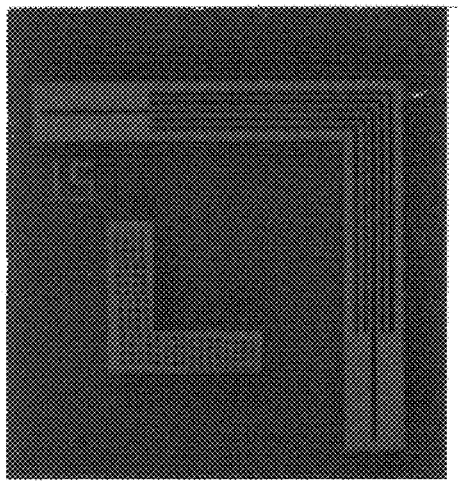
FIG._2
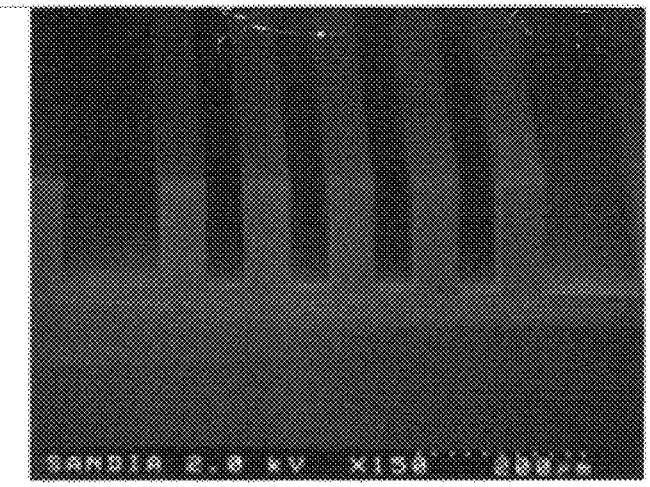
FIG._6
FIG._7
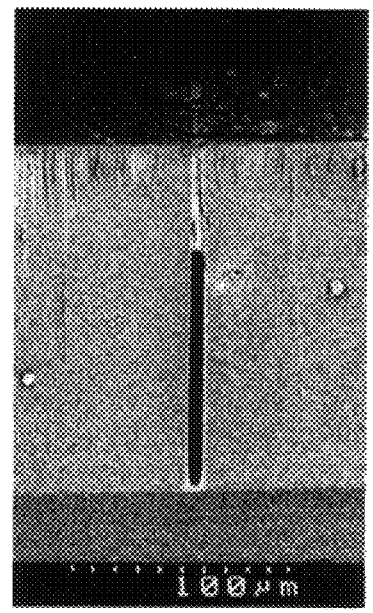

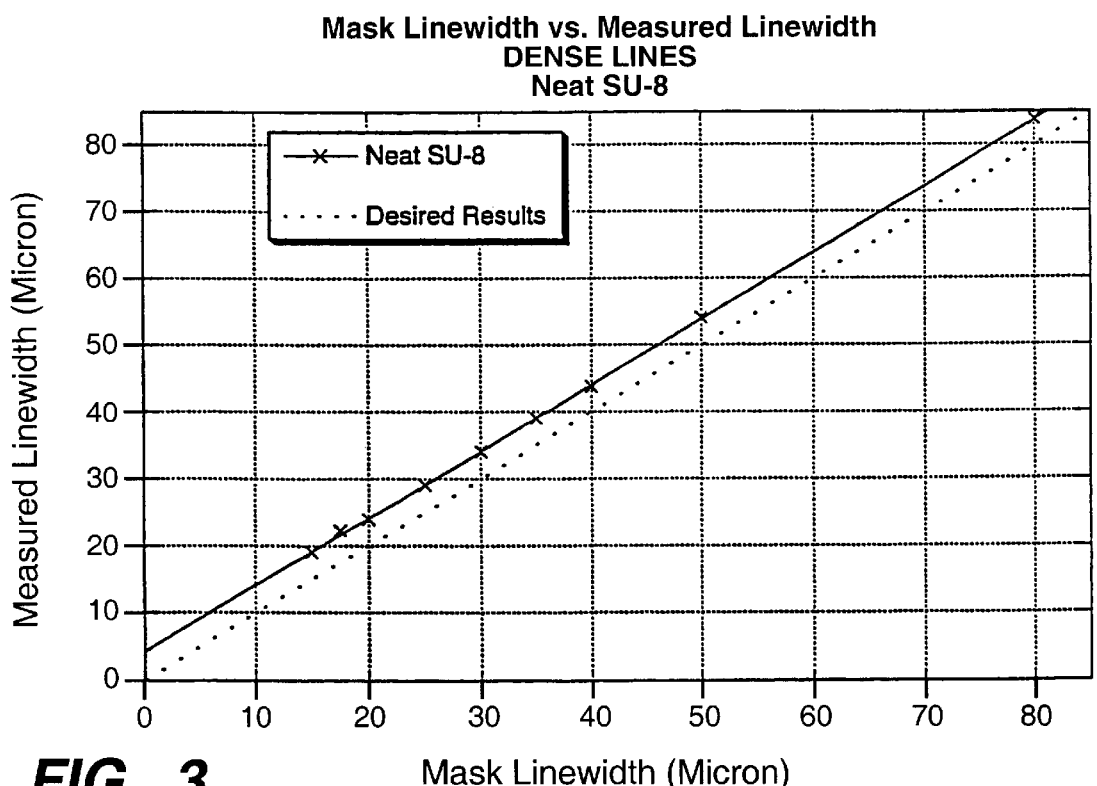
FIG._3
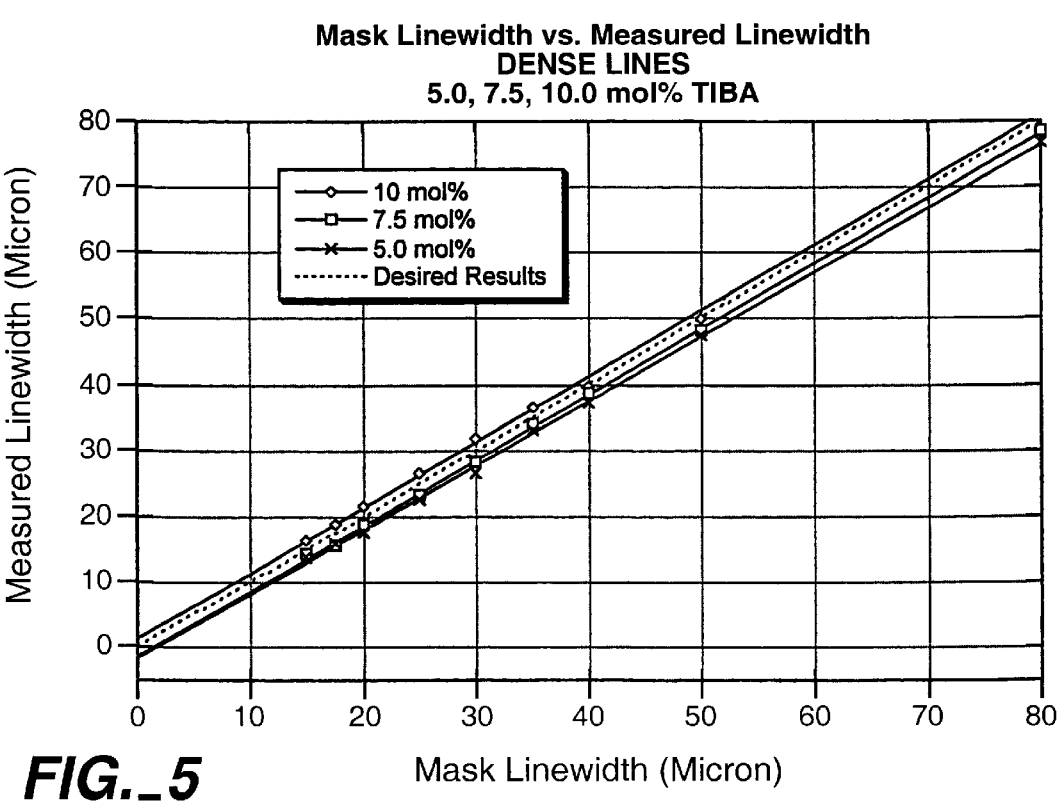
FIG._5

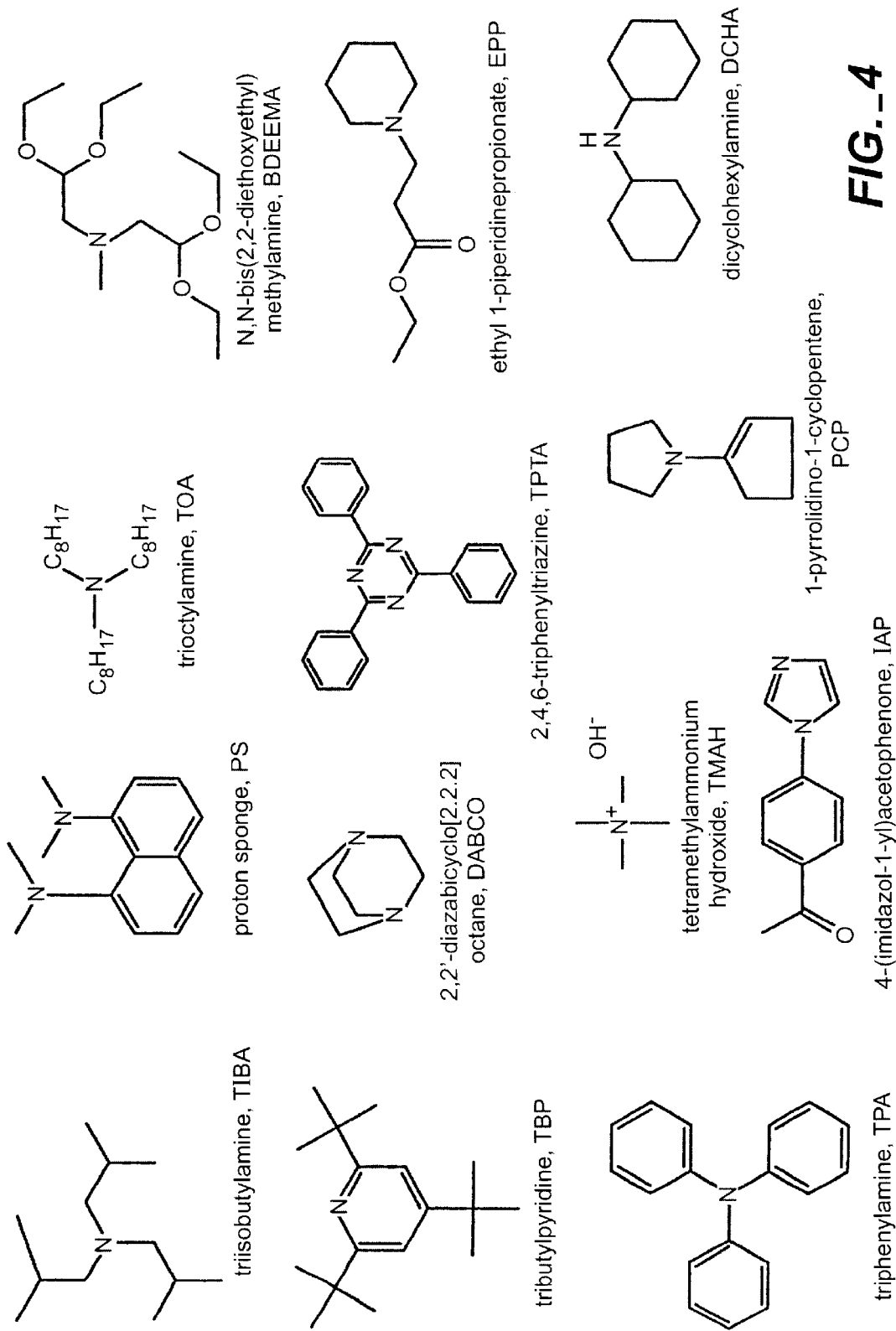
FIG._4

PHOTOIMAGEABLE COMPOSITION

PHOTOIMAGEABLE COMPOSITION

This invention was made with Government support under Contract No. DE-AC04-94AL85000 awarded by the U.S. Department of Energy to Sandia Corporation. The Government has certain rights to the invention.

FIELD OF THE INVENTION

The present invention is directed to photoimageable compositions of improved composition that do not exhibit appreciable amounts of process bias and have improved resolution. The invention is also directed to methods of fabricating microstructure metal parts using the photoimageable composition and particularly to fabricating microstructures having non-linear features.

BACKGROUND OF THE INVENTION

There are a variety of applications for which thick-film lithography may prove advantageous or even necessary. For instance, thick-film lithography may be used as a plating mold to create metal parts as in the LIGA process. Additionally, there may be applications in thick microelectromechanical systems or lithographically defined analytical systems such as, for example, chromatography columns or mass spectrometers. Typically, photoresist films greater than 50–100 microns thick are exposed with a synchrotron source; the hard x-rays produced assure good transmission within the photoresist and low diffraction from the mask. In addition, the low run-out from synchrotron sources produces sharp side walls, but synchrotron sources are scarce and expensive. Moreover, long exposure times on the order of hours to days are required.

Diazonapthoquinone/novolac (DNQ/novolac) resists that are exposed with ultraviolet radiation are used in microcircuit manufacturing, however, these materials suffer from several drawbacks. DNQ produces nitrogen gas upon exposure which phase separates prior to diffusing from thick films to create bubbles. Novolac materials form highly absorbing quinones, and the DNQ direct photolysis mechanism typically results in photoresist formulations exhibiting low transmittance. Careful bake steps are required to remove the casting solvent to avoid thermally inducing reactions with the DNQ. In addition, DNQ requires water for proper formation of the soluble, photoproduced acid which leads to requiring long reabsorbption times after the initial post-apply bake (PAB). Finally, novolac materials have a tendency to crack, which is particularly problematic for thick films.

A chemically-amplified negative resist, available from MicroChem Corp., Newton, Mass., under the tradename SU-8, circumvents many of these problems. The resist includes monomers and oligomers of bisphenol A, which have been quantitatively protected with glycidyl ether, and a photoacid generator (PAG). UV exposure creates a strong acid which cationically crosslinks the oligomers during a post-exposure bake (PEB) step to form a highly crosslinked network. The resist exhibits high transmission, creates no gas during exposure, and is thermally stable. UV exposures of the resist are typically on the order of minutes, and the cured product shows excellent imaging resolution. However, drawbacks of this resist include poor solvent development, shrinkage of the cured material, and difficulty in removing the cured material.

Recently, it has been found that the SU-8 resist tends to exhibit process bias. Specifically, lines in the resist tend to be larger than the lines on the mask, while printed trenches tend to be smaller. Process bias is particularly problematic with respect to printing sharp corners and oblique shapes. There are several possible explanations. First, non-ideal aerial images, such as from diffraction can cause these effects. It has been found, however, that the process bias is relatively independent of film thickness between 100 micron and 300 microns thick, and that process bias measurements using a contact aligner are quite similar to measurements made with a projection printer. In addition, it has been found that for 100 micron thick films, the bias is identical for 80 micron features where the aerial image should be nearly ideal, as it is for 12.5 $\mu$m features. For these reasons, aerial image affects appear to be only a minor contributor to the process bias. An alternate explanation is that the hexafluoroantimonic acid created upon exposure diffuses rapidly from the exposure area to cause crosslinking in the nominally unexposed areas.

The process bias depends on the radiation dose. Since it appears that increased resolution occurs with higher doses, it has been found that printing highest resolution features results in the worst process bias. The bias can be completely removed at some point by decreasing the dose, though severe loss of resolution and non-vertical side wall angles tend to result.

SUMMARY OF THE INVENTION

The invention is based in part on the demonstration that the use of selected amines in a photoimageable composition prevents process bias and improves resolution. It is believed that the amines react with the catalysts, e.g., photogenerated acids, to create an inert salt. Addition of the amines (i) reduces acid diffusion or at least the effects of small amounts of acid diffusion, and (ii) reduces the effects of small aerial image aberrations such as flare, since lightly exposed areas do not react at all. The amines may also improve the shelf-life of the photoimageable composition.

In one aspect, the invention is directed to a photoimageable composition that includes:
(a) a multifunctional polymeric epoxy resin that is dissolved in an organic solvent wherein the epoxy resin comprises oligomers of bisphenol A that are quantitatively protected by glycidyl ether and wherein the oligomers have an average functionality that ranges from about 3 to 12;
(b) a photoactive compound; and
(c) an amine that is selected from the group consisting of triisobutylamine (TIBA), 1,8-bis(dimethylamino) naphthalene (also known as PROTON SPONGE™) (PS), and 2,2'-diazabicyclo[2.2.2] octane (DABCO), and mixtures thereof.

Preferably, the oligomers have an average functionality of about 8 and the amine is TIBA.

In another aspect, the invention is directed to a method of fabricating microstructures that includes the steps of:
(a) forming a layer of photoimageable composition on a substrate surface wherein the photoimageable composition comprises:
(i) a multifunctional polymeric epoxy resin that is dissolved in an organic solvent wherein the epoxy resin comprises oligomers of bisphenol A that are quantitatively protected by glycidyl ether and wherein the oligomers have an average functionality that ranges from about 3 to 12;
(ii) a photoactive compound; and
(iii) an amine that is selected from the group consisting of TIBA, PS, DABCO, and mixtures thereof;

(b) exposing the layer of photoimageable composition to a pattern of radiation which produces a catalyst capable of changing the photoimageable composition's susceptibility to a developer; and (c) applying a developer to remove nonexposed portions of photoimageable compound which is susceptible to the developer.

In a further aspect, the invention is directed to a method of fabricating a metal structure that includes the steps of:

(a) forming a layer of photoimageable composition on a substrate surface wherein the photoimageable composition comprises:
   (i) a multifunctional polymeric epoxy resin that is dissolved wherein the epoxy resin comprises oligomers of bisphenol A that are quantitatively protected by glycidyl ether and wherein the oligomers have an average functionality that ranges from about 3 to 12;
   (ii) a photoactive compound; and
   (iii) an amine that is selected from the group consisting of TIBA, PS, DABCO, and mixtures thereof;

(b) exposing the layer of photoimageable composition to a pattern of radiation which produces a catalyst capable of changing the photoimageable composition's susceptibility to a developer;

(c) applying a developer to remove nonexposed portions of the photoimageable composition which are susceptible to the developer to create a mold area within exposed portions of the photoimageable composition;

(d) depositing a metal into the mold area; and (e) removing the exposed portions of the photoimageable composition to yield the metal structure.

BRIEF DESCRIPTION OF THE DRAWINGS

FIG. 1 is a photograph of the line/space elbow feature taken from a mask;

FIG. 2 is an SEM cross-section of line/space feature in the resist;

FIG. 3 is a graph of the process bias for neat SU-8 composition;

FIG. 4 are the chemical structures of thirteen bases tested;

FIG. 5 is a graph of the mask linewidth versus measured linewidth (the y=intercepts are as follows: for 5 mol %, y=−1.88; 7.5 mol %, y=−1.46; 10 mol %, y=1.12; and for the desired, line y=0);

FIG. 6 is the SEM cross-section of 5.0 mol % TIBA/SU-8 photoimageable composition with line/space feature (the line/space size is 10 μm and the resists is about 160 μm thick yielding an aspect ratio of about 16:1); and FIG. 7 is the SEM cross-section of an 8 μm isolated trench feature for 5.0 mol % TIBA/SU-8 photoimageable composition.

DESCRIPTION OF PREFERRED EMBODIMENT

Photoimageable compositions of the present invention generally comprise (a) a multifunctional polymeric epoxy resin that is dissolved in an organic solvent wherein the epoxy resin comprises oligomers of bisphenol A that are quantitatively protected by glycidyl ether and wherein the oligomers have an average functionality that ranges from about 3 to 12 and preferably about 8; (b) a photoactive compound; and (c) an amine that is selected from the group consisting of triisobutylamine (TIBA), 1,8-bis (dimethylamino)naphthalene 1,8-bis(dimethylamino) naphthalene (also known as PROTON SPONGE™) (PS), 2,2'-diazabicyclo[2.2.2] octane (DABCO) and mixtures thereof.

Preferably, the multifunctional polymeric epoxy resin comprises a bisphenol A novolac glycidyl ether having the following Structure (I):

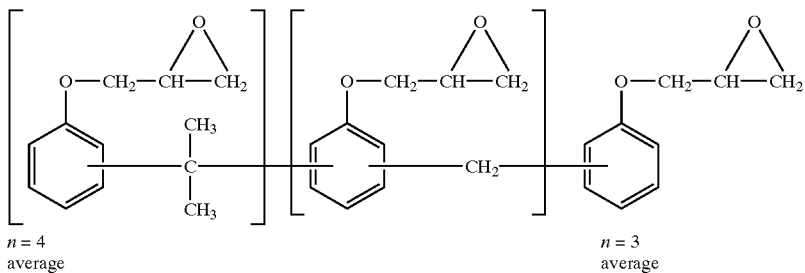

The multifunctional polymeric epoxy resin typically comprises about 80% to 99% and preferably about 93% to 99% by weight of the photoimageable composition.

The photoactive compound (PAC) comprises any suitable compound that undergoes a photochemical transformation upon absorption of photon to generate an acid or base. PACs include photoacid generators (PAG) and photobase generators (PAB). Typical PAGs include, for example, diaryliodonium salts, various nitrobenzyl esters and the like. A preferred PAG is triarylsulfonium salt. Other PACs include 4-octyloxyphenyl phenyliodonium hexafluoroantimonate, 4-methoxyphenyl phenyliodonium hexafluoroantimonate and 4-t-butylphenyl phenyliodoinum hexafluoroantimonate. The PAC typically comprises about 1% to 10% and preferably about 1% to 6% by weight based on the weight of the multifunctional polymeric epoxy resin.

The amount of amine used is about 0.1 mol % to 25 mol % and preferably about 1 mol % to 15 mol % based on the moles of PAC present.

The organic solvent comprises any suitable solvent for the components set forth above. Typical solvents include, for example, propylene glycol methyl ether acetate (PGMEA), γ-butyrolactone and cyclopentanone. The solvent typically comprises about 10% to 80% and preferably about 20% to 50% by weight of the photoimageable composition.

One embodiment of photoimageable composition of the present invention can be formulated by adding appropriate buffering amines to a chemically-amplified negative resist composition that is commercially available as SU-8-50 from MicroChem Corp. This commercial composition contains a resist mixture of monomers and oligomers of bisphenol A that are quantitatively protected by glycidyl ether and has an average functionality of 8 as represented by Structure (I) shown above. The solids content of the resist mixture is about 69% by weight. In addition, the composition includes triarylsulfonium hexafluoroantimonate salt as the photoacid generator which is assumed to be approximately 3.8% by weight of the solids. While the invention will be illustrated using SU-8 50, which is a formulation having a particular viscosity, it is understood that the buffering amines will also reduce or eliminate process bias in other photoimageable compositions containing the requisite components as defined above.

The photoimageable composition of the present invention can be employed in the same manner as conventional negative resist compositions but with improved results. For example, the photoimageable composition can be applied (e.g., spun) onto a substrate surface; the thickness of the film is determined by the composition's viscosity. A post-apply bake (PAB) step removes solvent from the film after coating. The photoimaging mechanism is initiated when radiation (e.g, ultraviolet radiation) is directed to regions of film to cause the production of photoacids or photobases which act as a catalyst in the subsequent crosslinking reaction that takes place during the post-exposure bake (PEB) step. The photoimageable composition is referred to as a negative photoimageable composition in that the exposed portions are not susceptible to removal by the developer while the unexposed composition portions are.

Photoimageable compositions of the present invention are particularly suited for making metal parts that have non-linear dimensions and/or high aspect ratios of from 0. 1 to 70. In particular, the compositions can be employed to manufacture microstructures or microcomponents which refer to three-dimensional solid structures whose critical features, height, width (or diameter) or length is less than about 100 microns, i.e., at least one dimension of the three-dimensional structure is less than about 100 microns. It has been demonstrated that the inventive photoimageable composition significantly reduces or eliminates the process bias associated with prior art resists. The term "bias" is used to describe the change in a dimension of a printed feature from its nominal value, i.e., the dimension of the mask. Usually the bias of interest is the change in the smallest of the dimensions of the critical feature whose tolerance is required.

Microstructures can be fabricated using LIGA processes. "LIGA" is a German acronym for a process involving X-ray lithography, electroplating, and plastic molding. Conventional sources of radiation including X-ray and ultraviolet radiation can be used with the inventive photoimageable composition. A typical LIGA process involves applying a layer of photoimageable composition onto a suitable substrate. The thickness of the layer is typically equal to or greater than the desired height of the microstructure. The photoimageable composition is then positioned behind a patterned mask and exposed to a collimated ultraviolet radiation. After exposure, a developer dissolves the non-irradiated areas. The resulting template or mold is then used to electroplate microstructures on the electroplating base. When electroplating is completed, the wafer is planarized, and the remaining polymer layer is removed to produce the microstructure.

EXPERIMENTAL

Various photoimageable compositions containing different buffering amines were prepared and tested to demonstrate the superior properties attained by using TIBA, PS, or DABCO. The photoimageable compositions with the buffering amines were formulated from SU-8 50 (MicroChem Corp., Marlboro, Mass.) as the nominal composition.

A. Materials and Coating Procedure

Four inch silicon wafers, 700–750 µm thick, from International Wafer Service were used without substrate preparation. SU-8 50 composition was spun cast at 1060 RPM for 15s. The wafer was baked for 7:30s on an 80° C. hotplate to dry it sufficiently for removal of edge bead. Subsequently, the wafer was spun at 650 RPM while acetone was streamed onto the edge of the wafer. The wafer proceeded through the PAB starting at room temperature, increased to 95° C. at 2° C./min, held at 95° C. for 22 minutes, then declined to room temperature at 1° C./min. All bake cycles were non-vacuum contact and the final film thickness was 150 µm. A Karl Suss MA6/BA6 Aligner was used for hard contact exposures of broad band DUV light; doses varied depending upon which, if any, base was present. Dose measurements were made at 365 nm. After exposure, PEB started at 65° C., ramped up to 85° C. at 2° C./min, held for 20 minutes, then declined to room temperature at 1° C./min. The wafer was placed into a dish containing SU-8 developer from MicroChem Corp. containing propylene glycol monomethyl ether acetate (PGMEA) and was lightly agitated until all the noncrosslinked resist cleared. This time to clear, $T_C$, was noted. The developer was then changed and the wafer sat in the developer for a total of three times the $T_C$. The wafer was dried using nitrogen gas. Each resist thickness was measured with a Tencor Alpha-Step 5000 Surface Profiler and the average was 166 µm, but individual wafer thickness could vary ±20 µm.

For preliminary screening of amines, the exposure dose was determined by the best-printed field on a wafer using an optical microscope at 10×. The determination of best field was somewhat subjective, but repeatable within ±~15% dose. The resolution test pattern had features of isolated and dense lines and spaces, and dense contacts and posts decreasing in size. For 150 µm thickness, the range of aspect ratios measured were from 10:1 to 2:1 with feature sizes of 15, 17.5, 20, 25, 30, 35, 40, 50 and 80 µm. An example of this pattern is shown in FIG. 1. The feature size is 15 µm.

The best field of a wafer was cleaved along the line and space features. For the initial experiments, only the three internal lines (the dense lines) of the five lines were measured in cross-section using a Hitachi S-4500 SEM, as shown in FIG. 2. (The photoimageable composition includes TIBA as the buffering amine.) The values at each linewidth size were averaged and then graphed as the measured linewidth in a mask linewidth versus measured linewidth graph. Since the graphs obtained indicated linearity, the y-intercept from this graph is the process bias. After the amines were screened using the dense line patterns, isolated trenches were also measured on promising samples to ensure that the base was affecting the process bias and it was not just the dose.

B. Amine Base Addition

The solids content was 69 wt % of total SU-8 50 composition and it was believed that the PAG was 3.8 wt % of solids. The bases were added at a chosen mol % of the PAG. The PAG was an impure mixture of several arylsulfonium hexafluoroantimonic salts with an assumed average molecular weight of 555 g/mol. Solid bases were dissolved in PGMEA before mixing with the SU-8 composition, while liquid bases were directly added to the SU-8 composition. Each mixture of base and SU-8 were inverted several times and rolled overnight to ensure mixing. All bases were from Aldrich (Milwaukee, Wis.) and used as received, except for tetramethylammonium hydroxide which was 0.242 N in water (LDD-26W, Shipley Co., Marlboro, Mass.).

RESULTS AND DISCUSSION

Preliminary experiments on neat SU-8 composition showed that doses for the best resolution printed lines larger than the mask dimensions while spaces printed smaller. During the experiment for each group of amine laden resist wafers, a neat SU-8 wafer was run alongside. A total of 9 neat SU-8 wafers were measured and their data combined yielding a bias average of 4.21 μm with a standard deviation of 2.3. This data is seen in FIG. 3 for dense lines at optimal dose of 1160±10 mJ/cm$^2$. While 4.21 μm is a small percentage of an 80 μm line, 12.5 μm lines can be printed at 150 μm thick and the process bias represents nearly 35% increase in linewidth. In addition, typical patterns include oblique shapes such as corners or gear teeth, and the bias associated with the photoresist rounds these features. In order to minimize the process bias, amines were added to scavenge low acid containing regions created by diffusion, flare in the optical system, etc. Structural properties was the main reason for selecting the amine bases. The 13 bases tested were sterically hindered amines to avoid potential thermal cross-linking of the epoxy. High boiling points were an important consideration for the amines to prevent their evaporation during the bake step, and amines that mixed well with the resin were also desired. Structures of the amines tested are shown in FIG. 4.

Initially, five amine bases were each added at 15 mol % against the estimated photoacid generator concentration. These bases were triisobutylamine (TIBA), trioctylamine (TOA), 2,4,6-triphenyltriazine (TPTA), tributylpyridine (TPA), and triphenylamine (TBP). It was apparent that 15 mol % was enough to affect the photoimageable composition because some of the added bases resulted in both higher doses needed and a lower process bias. At 15 mol % however, there was a problem of some amine/SU-8 mixtures dewetting from the silicon wafer surface and some causing extensive t-topping in the photoimageable composition. It was decided to utilize the amines at a lower concentration to mitigate the dewetting and t-topping problems.

The same five bases were mixed at 10 mol % with the SU-8 50. TOA was excluded immediately due to repeated photoimageable composition dewetting from the wafer, whether at 15 mol % or as low as 1.5 mol %. The process bias results of the other four were better than the results from 15 mol % mixtures and all other dewetting problems were eliminated. Table 1 sets forth the evaluations for neat SU-8 and first seven amines tested at 10 mol % to SU-8.

TABLE 1

| Base | Bias | Comments |
| --- | --- | --- |
| None | 4.2 | obvious process bias<br>clean, straight side walls |
| TIBA | 1.1 | t-topping<br>side walls clean and straight |
| TBP | 7.5 | nice side walls<br>bias not greatly decreased |
| TPTA | 5.3 | straight side walls<br>bias not greatly decreased |
| TPA | 7.7 | nice side walls<br>bias not greatly decreased |
| PS | −0.92 | great bias correction; clean straight side walls<br>adhesion problems |
| DABCO | 0.14 | great bias correction; clean straight side walls<br>adhesion problems |
| TMAH | 5.50 | side walls not that great<br>bias not greatly decreased |

As is apparent, neither TPA nor the TBP was effective at decreasing the process bias. In addition, tetramethylammonium hydroxide (TMAH), a base chosen for its low volatility, was ineffective at these concentrations. TIBA, PS and DABCO provided the best correction of the process bias by decreasing the linewidth as well as increasing the resolution of the photoimageable composition. It was common to resolve the 10 μm line/space patterns with the base versus resolving only the 15 μm and sometimes the 12.5 μm features using commercial resist SU-8. However, the PS and DABCO both exhibited adhesion problems. During development and wafer cleaving, these amine/SU-8 films flaked off of the wafer, which could cause problems during electroplating or lapping.

Five more amines were selected to test at 10 mol %. Again, sterically hindered amines that would not volatilize out of solution were chosen, but these five utilized different functional groups. Due to the rather poor performance of the alkyl or phenyl amines, amines with ester, ether, or ketone functional groups were chosen for better mixing of the base with the resin. 4-(imidazol-1-yl) acetophenone (IAP) was chosen because it contains two nitrogens, which served as a test in conjunction with the PS and DABCO for the effect of multiple nitrogens on the photoimageable composition. 1-pyrrolidino-1-cyclopentane (PCP) and N,N-bis(2,2-diethoxyethyl)methylamine (BDEEMA) were chosen because they are tertiary amines which seemed more likely to mix with the polymer, and dicyclohexylamine (DCHA) was chosen because it is a secondary amine which gave some insight to the necessity of steric hindrance. The results of adding these amines to SU-8 at 10 mol % are in set forth Table 2.

TABLE 2

| Base | Bias | Comments |
| --- | --- | --- |
| PCP | 0.049 | slanted side walls<br>high aspect ratio features had shaggy side walls |
| IAP | 0.13 | curved and bumpy lines<br>some t-topping |
| BDEEMA | −4.68 | extensive t-topping |
| EPC | 10.4 | t-topping all over<br>bloated lines |
| DCHA | — | all doses tried looked horrible; none worth cleaving |

The EPC and BDEEMA were unacceptable due to poor bias correction and problems with the printed lines. DCHA was eliminated because a dose for optimal resolution could not be found. At a variety of doses, the DCHA/SU-8 could barely print the features, possibly because DCHA as an added amine would need a different baking cycle. DCHA was eliminated because all the other amines baked fine at the nominal PAB and PEB. The PCP was by far the best of these bases; it had a great effect on the process bias and had only a slight problem with slanting side walls.

In order to minimize the side effects of the most promising amines and to further assess their ability to affect process bias and resolution, the four best amines were tried at 5 mol % concentration and the results are set forth in Table 3.

TABLE 3

| Base | Bias | Comments |
| --- | --- | --- |
| TIBA | −1.9 | looks like SU-8 |
| DABCO | 0.41 | some adhesion problems; weary about using |
| PS | 0.79 | some adhesion problems; weary about using |
| PCP | 2.55 | adhesion problems<br>slanted walls |

The PCP still had slanted side walls and adhesion problems. DABCO and PS maintained substantial corrections to the process bias, but the persistent adhesion problems made them less acceptable than TIBA, which showed substantial bias correction, vertical side walls, improved resolution and there was no indication of adhesion problems.

TIBA, the amine providing the best results from the total selection, was printed again at 10 mol %, 7.5 mol % and 5.0 mol % to determine which concentration was optimal for affecting the photoimageable composition. For the 10 mol % TIBA, two wafers were run at its optimum dose, 1816±20 mJ/cm$^2$. The graph defining the process bias for 10 mol %, 7.5 mol %, and 5.0 mol % TIBA is shown as FIG. 5. The resulting process bias for the 10 mol % was 1.12 $\mu$m with a standard deviation of 2.3 and good feature resolution down to the 10 $\mu$m line/space features. For the 7.5 mol % TIBA, 4 wafers were run at optimum dose of 1900±70 mJ/cm$^2$, which had an average bias of −1.46 $\mu$m and a standard deviation of 1.4. Good resolution for these four wafers was down to the 10 $\mu$m and even 8 $\mu$m features. For the 5.0 mol % TIBA, 3 wafers were run at the optimum dose of 1140 mJ/cm$^2$; the process bias was −1.88 $\mu$m with a 1.3 standard deviation. For the line/space feature, the resolution was good to 8 $\mu$m. Note that neat SU-8 at its optimum dose of 1160±10 mJ/cm$^2$ had its average of 4.21 with a standard deviation of 2.3, and resolution good to 15 $\mu$m features, sometimes to the 12.5 $\mu$m feature. Comparing these process bias averages and standard deviations for different concentration TIBA/SU-8 mixtures to that of neat SU-8 provides additional evidence that adding the amines was actually affecting the process bias.

Adding TIBA alleviated the process bias of the photoimageable composition by reducing it beyond zero, but the specifics of which TIBA concentration is superior is not clear. Each concentration reduced the bias and simultaneously increased the resolution of the photoimageable composition, but did so irregularly. With all three percentages, good resolution is seen to the 15:1 aspect ratio features and sometimes even the 18.5:1 (mask linewidth of ~8 $\mu$m), where the neat SU-8 printed with good resolution to 10:1 and occasionally 12.5:1. FIG. 6 is a SEM showing the high resolving power of the photoimageable composition with 5.0 mol % TIBA. The line/space feature in the SEM is 10 $\mu$m, which is a size that could not be resolved using the neat SU-8. The touching at the top of the lines is due to the high aspect ratio (16:1) causing the tall features not to be able to stand on their own. The TIBA is definitely affecting the photoimageable composition. Separating the individual effects of the three different concentrations from the subtleties and repeatability in the lithographic procedure that engender changes from one wafer to the next is difficult with the present level of process control. By obtaining better process control, the small differences in the resist formulation can be characterized and wafers produced will be more repeatable.

Another method used to determine if the amine/SU-8 mixture affected the process bias and resolution was to measure the isolated trench widths in addition to the dense line linewidths. If the amine/SU-8 mixture was working and the amine decreased linewidth in the dense lines to the mask line size, then the isolated trench widths would simultaneously increase to the mask trench size. In all cases the isolated trench widths were increased, even to values greater than the mask values, while maintaining good resolution in the resist. For the neat resist at optimal dose, the process bias for isolated trenches was −1.96 $\mu$m. The isolated trench bias for the 5.0% and 7.5% concentration of TIBA in SU-8 both increased past zero: at optimal dose for the 7.5 mol % the process bias was 0.95 $\mu$m and the 5.0 mol % gave a process bias of 0.18 gm. The 10 mol % isolated trenches weren't measured at the optimal dose. FIG. 7 is a SEM of 5.0 mol % TIBA/SU-8 photoimageable composition where the 8 $\mu$m, ~20:1 aspect ratio trench was resolved. Clearing the 8 $\mu$m trench is astounding since the neat SU-8 regularly would only clear to the 15 $\mu$m isolated trench. The only drawback with resolving the higher aspect ratio features is the problem of scumming. Scumming, or the redepositing of polymer to the top level of a feature, is not as easily seen with the larger sized features. Many feature cross-sections look like the SEM in FIG. 2. Once the feature size gets smaller, the same amount of scum takes a greater toll, causing high aspect ratio spaces and trenches to become partially filled with scum and lines to fall over as seen in FIG. 6. It is important however to recognize that with the same aerial image, higher aspect ratio features are being resolved. This and the simultaneous increase in the process bias for the isolated trenches past zero supports the hypothesis that the addition of the base is affecting the process bias and creating a more optimal photoimageable composition.

Addition of small quantities of amine to SU-8 photoimageable composition reduced the process bias for dense lines and simultaneously for isolated trenches. In addition, a higher resolving power photoimageable composition has resulted. It was difficult to ascertain a structural characteristic of the amines that predicted success in removing the process bias and concomitantly would not cause detrimental changes such as adhesion failure, poor imaging, or poor film forming capability. While it is necessary to focus on sterically hindered amines, none of the tertiary amines tried showed indication of base-catalyzed thermal crosslinking of the epoxy.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A photoimageable composition comprising:
   (a) a multifunctional polymeric epoxy resin that is dissolved in an organic solvent wherein the epoxy resin comprises oligomers of bisphenol A that are quantitatively protected by glycidyl ether and wherein the oligomers have an average functionality that ranges from about 3 to 12;
   (b) a photoactive compound; and
   (c) an amine that is selected from the group consisting of triisobutylamine (TIBA), 1,8-bis(dimethylamino) naphthalene, and 2,2'-diazabicyclo[2.2.2] octane and mixtures thereof.

2. The photoimageable composition of claim 1 wherein the resin further comprises monomers of bisphenol A that is quantitatively protected by glycidyl ether.

3. The photoimageable composition of claim 1 wherein the multifunctional polymeric epoxy resin comprises a bisphenol A novolac glycidyl ether.

4. The photoimageable of claim 1 wherein the photoactive compound comprises a cationic photoinitiator.

5. The photoimageable composition of claim 4 wherein the cationic photoinitiator is an onium salt.

6. The photoimageable composition of claim 5 wherein the onium salt is a mixture of triarylsulfonium salts.

7. The photoimageable composition of claim 6 wherein the triaryl-sulfonium salts comprise triarylsulfonium hexafluoroantimonate.

8. The photoimageable composition of claim 1 wherein the amine is TIBA.

9. The photoimageable composition of claim 1 wherein the amount of amine is about 0.01 mol % to 30 mol % of the amount of the photoactive compound.

10. The photoimageable composition of claim 1 wherein the oligomers have an average functionality of about 8.

11. A method of fabricating microstructures that comprises the steps of:
   (a) forming a layer of photoimageable composition on a substrate surface wherein the photoimageable composition comprises:
      (i) a multifunctional polymeric epoxy resin that is dissolved in an organic solvent wherein the epoxy resin comprises oligomers of bisphenol A that are quantitatively protected by glycidyl ether and wherein the oligomers have an average functionality that ranges from about 3 to 12;
      (ii) a photoactive compound; and
      (iii) an amine that is selected from the group consisting of triisobutylamine (TIBA), 1,8-bis(dimethylamino) naphthalene, 2,2'-diazabicyclo[2.2.2] octane and mixtures thereof;
   (b) exposing the layer of photoimageable composition to a pattern of radiation which prouduces a catalyst capable of changing the photoimageable composition's susceptibility to a developer; and
   (c) applying a developer to remove nonexposed portions of the photoimageable compound which are susceptible to the developer.

12. The method of claim 11 wherein the resin further comprises monomers of bisphenol A that is quantitatively protected by glycidyl ether.

13. The method of claim 11 wherein step (b) comprises exposing the layer of photoimageable composition with a pattern of ultraviolet radiation.

14. The method of claim 11 wherein step (c) creates a photoimageable layer defining one or more open patterns therein.

15. The method of claim 14 further comprising step (d) of filling the one or more open patterns with a metal.

16. The method of claim 14 wherein the one or more open patterns have non-linear dimensions.

17. The method of claim 11 wherein the multifunctional polymeric epoxy resin comprises a bisphenol A novolac glycidyl ether.

18. The method of claim 11 wherein the photoactive compound comprises a cationic photoinitiator.

19. The method of claim 18 wherein the cationic photoinitiator is an onium salt.

20. The method of claim 19 wherein the onium salt is a mixture of triarylsulfonium salts.

21. The method of claim 20 wherein the triarylsulfonium salts comprise triarylsulfonium hexafluoroantimonate.

22. The method of claim 11 wherein the amine is TIBA.

23. The method of claim 11 wherein the amount of amine in the photoimageable composition is about 0.01 mol % to 30 mol % of the amount of the photoactive compound.

24. The method of claim 11 wherein the oligomers have an average functionality of about 8.

25. A method of fabricating a metal structure that comprises the steps of:
   (a) forming a layer of photoimageable composition on a substrate surface wherein the photoimageable composition comprises:
      (i) a multifunctional polymeric epoxy resin that is dissolved in an organic solvent wherein the epoxy resin comprises oligomers of bisphenol A that is quantitatively protected by glycidyl ether and wherein the oligomers have an average functionality that ranges from about 3 to 12;
      (ii) a photoactive compound; and
      (iii) an amine that is selected from the group consisting of triisobutylamine (TIBA), 1,8-bis(dimethylamino) naphthalene, 1,4'-diazabicyclo[2.2.2] octane and mixtures thereof;
   (b) exposing the layer of photoimageable composition to a pattern of radiation which changes the photoimageable composition's susceptibility to a developer;
   (c) applying a developer to remove nonexposed portions of the photoimageable composition which are susceptible to the developer to create a mold area within an exposed portions of the photoimageable composition;
   (d) depositing a metal into the mold area; and
   (e) removing the exposed photoimageable composition to yield the metal structure.

26. The method of claim 25 wherein the resin further comprises monomers of bisphenol A that is quantitatively protected by glycidyl ether.

27. The method of claim 25 wherein step (b) comprises exposing the layer of photoimageable composition with a pattern of ultraviolet radiation.

28. The method of claim 25 wherein the metal structure formed has a nonlinear surface.

29. The method of claim 25 wherein the metal structure formed has a curve surface.

30. The method of claim 25 wherein the multifunctional polymeric epoxy resin comprises a bisphenol A novolac glycidyl ether.

31. The method of claim 25 wherein the photoactive compound comprises a cationic photoinitiator.

32. The method of claim 31 wherein the cationic photoinitiator is an onium salt.

33. The method of claim 32 wherein the onium salt is a mixture of triarylsulfonium salts.

34. The method of claim 33 wherein the triarylsulfonium salts comprise triarylsulfonium hexafluoroantimonate.

35. The method of claim 25 wherein the amine is TIBA.

36. The method of claim 25 wherein the amount of amine in the photoimageable composition is about 0.01 mol % to 30 mol % of the amount of the photoactive compound.

37. The method of claim 25 wherein the oligomers have an average functionality of about 8.

* * * * *

UNITED STATES PATENT AND TRADEMARK OFFICE
CERTIFICATE OF CORRECTION

PATENT NO.    : 6,645,696 B1
DATED         : November 11, 2003
INVENTOR(S)   : Simison et al.

It is certified that error appears in the above-identified patent and that said Letters Patent is hereby corrected as shown below:

<u>Title page,</u>
Insert item:
-- [*] Notice:   Subject to any disclaimer, the term of this patent is extended or adjusted under 35 U.S.C. 154(b) by 0 days. --

Signed and Sealed this

Sixth Day of April, 2004

JON W. DUDAS
*Acting Director of the United States Patent and Trademark Office*